United States Patent
Chung et al.

(10) Patent No.: US 7,852,686 B2
(45) Date of Patent: Dec. 14, 2010

(54) CIRCUIT AND METHOD FOR A SENSE AMPLIFIER WITH INSTANTANEOUS PULL UP/PULL DOWN SENSING

(75) Inventors: Shine Chung, Taipei (TW); Jonathan Hung, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 299 days.

(21) Appl. No.: 12/062,320

(22) Filed: Apr. 3, 2008

(65) Prior Publication Data

US 2009/0251975 A1 Oct. 8, 2009

(51) Int. Cl.
*G11C 16/04* (2006.01)
(52) U.S. Cl. .................. 365/189.11; 365/205; 365/207; 365/222; 365/233.17; 365/233.14; 365/189.05; 365/196
(58) Field of Classification Search ............... 365/49.12, 365/102, 149, 154, 156, 186, 189.15, 189.05, 365/196, 202, 203, 204, 205, 207, 222, 233.17, 365/233.14
See application file for complete search history.

(56) References Cited

U.S. PATENT DOCUMENTS

2005/0247997 A1* 11/2005 Chung et al. ............... 257/530
2007/0195624 A1* 8/2007 Song ........................ 365/205

OTHER PUBLICATIONS

Sarpeshkar, R., et al., "Mismatch Sensitivity of a Simultaneously Latched CMOS Sense Amplifier," IEEE Journal of Solid State Circuits, vol. 26, No. 10, pp. 1413-1422, Oct. 1991.

Kitsukawa, G., et al., "A 23-ns 1—Mb BiCMOS DRAM," IEEE Journal of Solid-State Circuits, vol. 25, No. 5, pp. 1102-1111, Oct. 1990.

Kawahara, T., et al., "Deep-Submicrometer BiCMOS Circuit Technology for Sub-10-ns ECL 4-Mb DRAM's," IEEE Journal of Solid State Circuits, vol. 27, No. 4, pp. 589-596, Apr. 1992.

Akiyama, S., et al., "Concordance Memory Design Using Statistical Integration for the Billions-Transistor Era," ISSCC 2005, Session 25, Dynamic Memory, 25.5, pp. 466-467, 610. 2005 IEEE International Solid-State Circuits Conference.

(Continued)

*Primary Examiner*—Hoai V Ho
*Assistant Examiner*—Fernando N Hidalgo
(74) *Attorney, Agent, or Firm*—Slater & Matsil, L.L.P.

(57) ABSTRACT

A circuit and method for a sense amplifier for sensing the charge stored when a select signal couples a memory cell to the sense amplifier. A pull up voltage and a pull down voltage are instantaneously supplied to the sense amplifier to sense the small signal differential input on the complementary bit lines and to simultaneously restore the value stored in the memory cell. A differential output signal generator circuit is provided to instantaneously supply the pull up and pull down voltages. In another preferred embodiment the signal generator provides the pull up and pull down voltages at a first level and subsequently increases the pull up voltage to a voltage greater than the positive supply voltage and decreases the pull down voltage. A method of sensing is disclosed wherein the sense and restore actions are performed instantaneously to provide memory cell sensing with greater tolerance of device mismatches.

9 Claims, 6 Drawing Sheets

OTHER PUBLICATIONS

Sarpeshkar, R., et al., "Analysis of Mismatch Sensitivity in a Simultaneously Latched CMOS Sense Amplifier," IEEE Transactions on Circuits and Systems-II: Analog and Digital Signal Processing, vol. 39, No. 5, pp. 277-292, May 1992.

Ieda, N., et al. "Single Transistor MOS RAM Using a Short-Channel MOS Transistor," IEEE Journal of Solid-State Circuits, vol. SC-13, No. 2, pp. 218-224, Apr. 1978.

Shirahama, M., et al., "A 400MHz Random-Cycle Dual-port Interleaved DRAM with Striped-Trench Capacitor", ISSCC 2005, Session 25, Dynamic Memory, 25.3, pp. 462-463, 610. 2005 IEEE International Solid-State Circuits Conference.

Nagai, T., et al., "A 17ns Mb CMOS DRAM Using Direct Bit-Line Sensing Tenique," ISSCC 1991, Session 3, High Speed RAM, Paper WP 3.7, pp. 58-59, 290. 1991 IEEE International Solid-State Circuits Conference.

Kitsukawa, G., et al., "Design of ECL 1-Mb BiCMOS DRAM," Electronics and Communications in Japan, Part 2, vol. 75, No. 5, pp. 89-102, 1992.

* cited by examiner

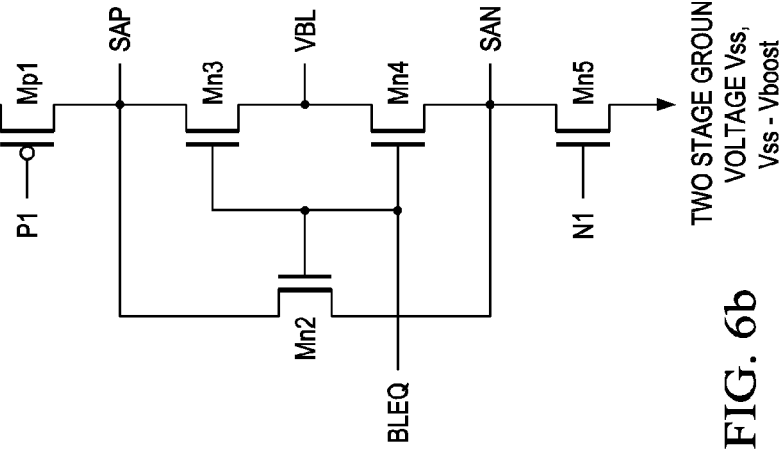
FIG. 6b
FIG. 5
| TIMING (EXAMPLE) | STAGE ONE | STAGE TWO |
|---|---|---|
| SAN | VSS (SHALLOW) | BOOSTED NEGATIVE POWER (DEEPER) |
| SAP | VCC (SHALLOW) | BOOSTED POSITIVE POWER (HIGHER) |
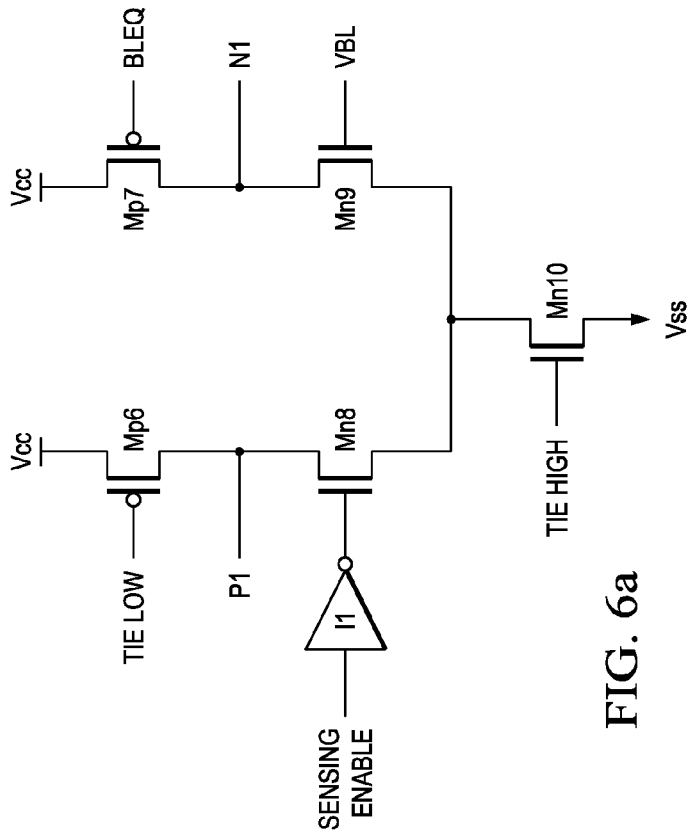
FIG. 6a

CIRCUIT AND METHOD FOR A SENSE AMPLIFIER WITH INSTANTANEOUS PULL UP/PULL DOWN SENSING

TECHNICAL FIELD

The present invention relates to a circuit and method for providing an improved sense amplifier for use in memory circuits. Memory cells including DRAM cells store data in the form of small charges that are capacitively stored. These memory cells are accessed by the use of a differential sense amplifier that receives a small differential input voltage signal on a pair of complementary differential bit lines, the difference voltage corresponding to the charge stored in a selected memory cell. After sensing this voltage, the sense amplifiers amplify the difference voltage to a logic level by latching the small differential signal in a differential sense latch. The present invention is directed to improving the operation of the sense amplifier to compensate for increasingly significant transistor mismatch problems while maintaining high overall performance.

BACKGROUND

Highly integrated semiconductor circuits are increasingly important, particularly in producing battery-operated devices, such as cell phones, portable computers, such as laptops, notebook and PDAs, wireless email terminals, MP3 audio and video players, portable wireless web browsers, and the like, and these integrated circuits increasingly include on-board data storage. As is known in the art, such data storage may take the form of dynamic memory in which arrays of cells are provided, wherein each cell is a storage capacitor formed with an associated adjacent access transistor. Data stored in such memory cells is actually a charge stored on a small capacitor, and the data is accessed by a sense amplifier.

Sense amplifiers are differential amplifiers. The input and output lines are the same, typically referred to as bit lines or column lines, and the sense amplifier operates by first receiving a small differential voltage on one of the bit lines, while the other remains at a nominal pre-charged or equalized voltage. The small differential voltage is the result of one memory cell coupled on one of a pair of complementary bit lines being discharged (or, alternatively, charged) in response to a row selection line, or word line, being active. Typically the memory cell has a single access transistor with its gate or control terminal coupled to the row line. Some time after the row line becomes active and the small differential voltage appears on one of the complementary bit lines, the sense amplifier will sense the differential voltage and input it into a differential input latch circuit. This cross-coupled latch circuit will then amplify the small differential input voltage so that a full logic level differential voltage appears on the complementary bit lines. This mechanism thus allows an output circuit to couple the pair of bit lines to a data output circuit for the memory. The full logic level also allows the memory cell to restore the data into the memory cell storage capacitor. Because the access cycle (read) is a destructive read out cycle the cell charge must then be restored following the read in order for the cell to maintain its value.

Dynamic memory cells may be used in stand alone, or commodity, memory devices such as DRAM integrated circuits (ICs). These ICs are usually supplied in the form of cards populated with integrated circuits to make a complete array of memory, for example SIMM or DIMM cards, and sold as a finished memory for a desktop or laptop PC. Increasingly, embedded memory is becoming important in the production of advanced integrated circuits. These embedded memory modules may be a portion of an integrated circuit that provides an entire system in one IC, so-called system on a chip (SOC) or system on integrated circuit (SOIC) devices. These devices may provide, for example, all of the circuitry needed to implement a cell phone, or a personal data assistant (PDA), digital VCR, digital camcorder, digital camera, MP3 player, or the like. The embedded memory arrays used in such devices must be very space efficient, power efficient, reliable and compatible with semiconductor processes that form logic circuitry and other types of circuitry on board the same device.

As integrated circuits are fabricated using semiconductor processes with smaller and smaller feature sizes, the tendency for devices to have device mismatch problems increases. Smaller MOS devices are subject to more short channel effects and higher leakage currents, which require higher threshold voltages Vt. Smaller geometries can lead to higher threshold voltages Vt mismatches between devices, as these mismatches scale inversely to the square root of the product of gate width times length. Transistors fabricated on the same integrated circuit may have widely varying threshold voltages Vt due to these device mismatches.

A differential circuit such as a sense amplifier has multiple devices operating in a balanced fashion and thus any device mismatches may lead to incorrect operation. A paper studying the effects of mismatches in sense amplifiers for DRAMs is "Mismatch Sensitivity of a Simultaneously Latched CMOS Sense Amplifier," Sarpeshkar, et al., IEEE Journal of Solid State Circuits, Vol. 26, No. 10, October 1991, pp. 1413-1422. In the paper the ideal CMOS sense amplifier, such as in FIG. 1, is described as being perfectly balanced when the parameters of the four transistors that make up the two, cross-coupled inverters of the sense latch are all perfectly matched, that is the threshold voltages and the parasitic capacitances such as $C_{gp}$ (for PMOS) and $C_{gn}$ (for NMOS) and the line capacitances of the bit lines $C_{bl}$ are all in balance. The ideal sense amplifier is also vertically matched when the word line W/L ratios of the PMOS and NMOS transistors are ratioed so that the pull up transistors (P types, usually with smaller gains) are balanced with the pull down transistors (N types, with larger gains). The paper also illustrates that if the sense amplifier is not perfectly matched, and the sensed voltage is small, the mismatch can cause errors in operation, the sense latch can take the wrong value.

The criterion for correct sense amplification sensing may be stated that the voltage being sensed, $\Delta Vbl$, must be greater than the mismatched voltages caused mostly by the NMOS Vt mismatches:

$$\Delta Vbl = Cs/(Cs+Ct)*(Vsn-Vbl)*(1-\exp(-\alpha t0)). \tag{1}$$

The sensitivities of capacitances Cs, Ct and $\alpha$ to the differential voltage $\Delta Vbl$ may be calculated and modeled as independent Gaussian random variables, where Cs, Vsn and $\alpha$ are the cell capacitance, cell storage voltage, and the inverse of the charge sharing time constant, that is $\alpha = gmc/(Cs||Ct)$, where gmc is the gm of the cell pass transistor, and Ct is Cbl (bitline capacitance) plus the SA device loadings.

In the prior art, sensing errors in sense amplifier operations were often avoided by determining a minimum supply voltage level (Vcc), i.e., the minimum supply voltage level that can be used for reliable operations in the sense amplifier. As transistor mismatches increase for a particular process technology (mismatches increase with smaller minimum feature sizes), the Vcc minimum voltage that can reliably be used to supply the memory circuitry is increased. This increase in the required minimum Vcc results in increased power consumption and is undesirable. Also, the speed of the memory operations is hindered by the time needed for the bit lines to reach full Vdd levels with these higher Vcc specified. The major difficulties of advanced semiconductor process memory design are 1) higher voltage threshold Vt., 2) lower supply voltage; and 3) worse mismatch. These difficulties result in a higher Vcc minimum requirement than is desired.

Thus, there is a continuing need for a memory sense amplifier circuit that provides reliable and fast operation in spite of device mismatch problems that increasingly occur due to advances in semiconductor process technology, with a lower Vcc minimum requirement and error free operation, without significant increases in sense amplifier silicon area or power requirements.

SUMMARY OF THE INVENTION

These and other problems are generally solved or circumvented, and technical advantages are generally achieved, by embodiments of the present invention, which provides circuits and methods to improve the operation of sense amplifiers without requiring a higher Vcc minimum to cope with device mismatches.

In one preferred embodiment, a sense amplifier is provided with a positive and a negative potential control signal. These controls signals are provided instantaneously together, that is with a timing difference of less than about 20 picoseconds. Because the pull down and pull up (sense and restore) transistors are simultaneously active, the circuit can be shown to operate with a better tolerance for device mismatches without an increase in Vcc minimum.

In another preferred embodiment, a sense amplifier is provided with a positive and a negative control signal that are instantaneously provided at a first positive and a first negative potential, respectively, with respect to an initial equalized potential, and then a second level of potential is applied with a higher positive and a lower negative potential. This two level control signal scheme further improves the performance of the sense amplifier.

In another preferred embodiment, the positive and negative control signals to the sense amplifier are provided by a signal generator circuit that is a differential output circuit that receives an enable signal. In a further preferred embodiment, the differential signal generator circuit further comprises a sense amplifier equalization circuit that provides the second level of positive and negative potential following the enable signal.

In a preferred method, a sense amplifier for a memory circuit is operated by instantaneously applying the positive and negative control signals to the sense latch in the sense amplifier, thereby overcoming any device mismatches in the transistors in the sense amplifier. In another preferred method, a first positive and a first negative potential are instantaneously provided to sense amplifier positive and negative control signals, and subsequently an increased second potential is applied to the positive control signal and a decreased negative potential is applied to the negative control signal to improve the performance of the sense amplifier.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 5 illustrates a table explaining the voltages on control signals of the preferred embodiments in a first and second stage of operation;

FIG. 6a illustrates a circuit diagram of a first signal generator circuit of the preferred embodiments, and FIG. 6b illustrates a circuit diagram of an equalization circuit of the preferred embodiments.

DETAILED DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
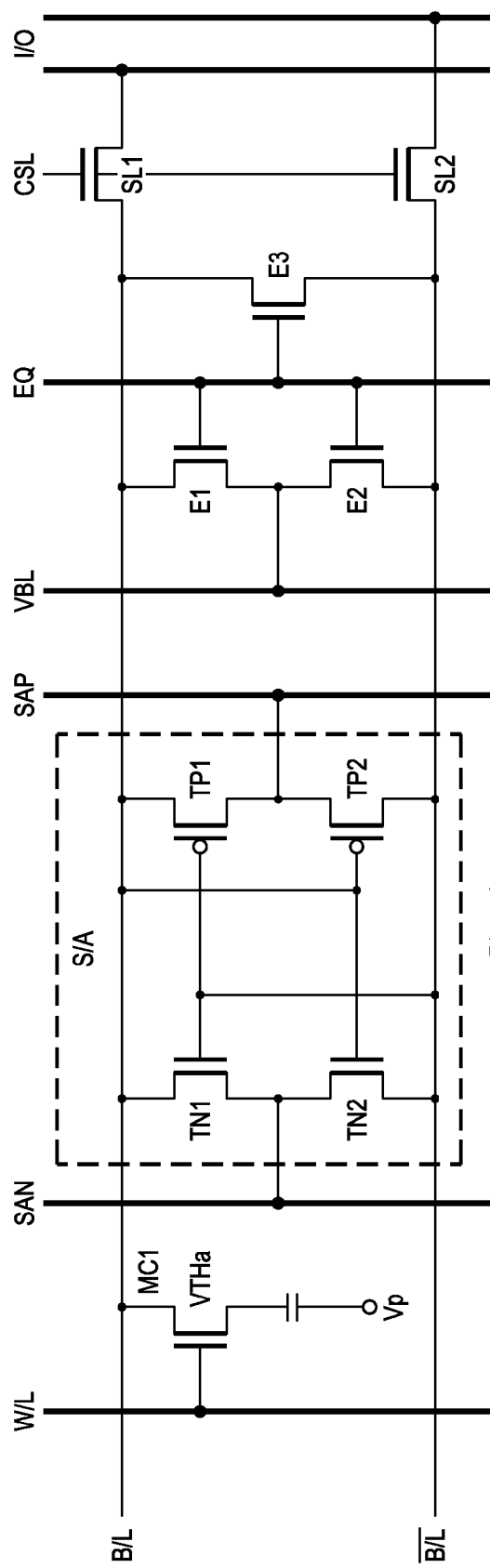
FIG. 1 illustrates a simplified circuit diagram for a portion of a memory circuit including a sense amplifier.

FIG. 1 depicts a small portion of a typical memory circuit using dynamic memory cells and sense amplifiers. Dynamic memory stores data in a capacitance that must, periodically, be refreshed because the stored charge leaks away over time. As is known in the art, timing circuitry (hardware or software) will track the time elapsed since the last access and will cause the circuit to "refresh" the cells when needed by performing a read followed by a restore or write back cycle. Any read of a memory cell such as the cell in FIG. 1 is destructive, so the cell is always restored or rewritten at the end of the cycle. A "write" is simply a read cycle with write data impressed during the "restore" portion of the cycle, which is when the read data is replaced with new data and the new data is written into the cell. Thousands or even millions of these memory cells are used to form a commercial memory device.

In FIG. 1, memory cell MC1 is coupled at an intersection between a row or word line W/L and a column or bit line B/L. Although only one memory cell MC1 is depicted for simplicity, another cell will be placed at the intersection of each of a plurality of word lines W/L and the bit line B/L. Similarly, a plurality of memory cells will also be placed at the intersections of each of a plurality of row lines W/L (only one of which is depicted in FIG. 1) and the complementary bit line B/L_ of FIG. 1. A portion of a memory circuit MC1 may have 8, 16, 32, 64, 128 or more columns, typically arranged in word widths, and many word lines or rows typically arranged across the bit lines. Conventionally the word lines or rows are laid out orthogonally to the columns as depicted in FIG. 1, although other arrangements are known. Sense amplifier S/A is coupled to a pair of bit lines. Each pair of bit lines B/L and B/L_ in the array will be coupled to such a sense amplifier. The bit lines B/L and B/L_ are further coupled to the I/O lines I/O through the use of column select line circuit controlled by CSL and coupling transistors SL1 and SL2. In this manner many columns of memory cells may be arranged in subarrays and selectively coupled to the I/O lines I/O so that, for a particular memory cycle, one memory cell is coupled to each bit (column) line of the I/O lines I/O. The I/O lines I/O will be arranged in a group to form a word of data for each cycle, for example the device may be a ×8 device with eight I/O lines I/O forming a word. Devises that are 16 bits wide (×16), ×32 and ×64 are also known.

Figure 2:
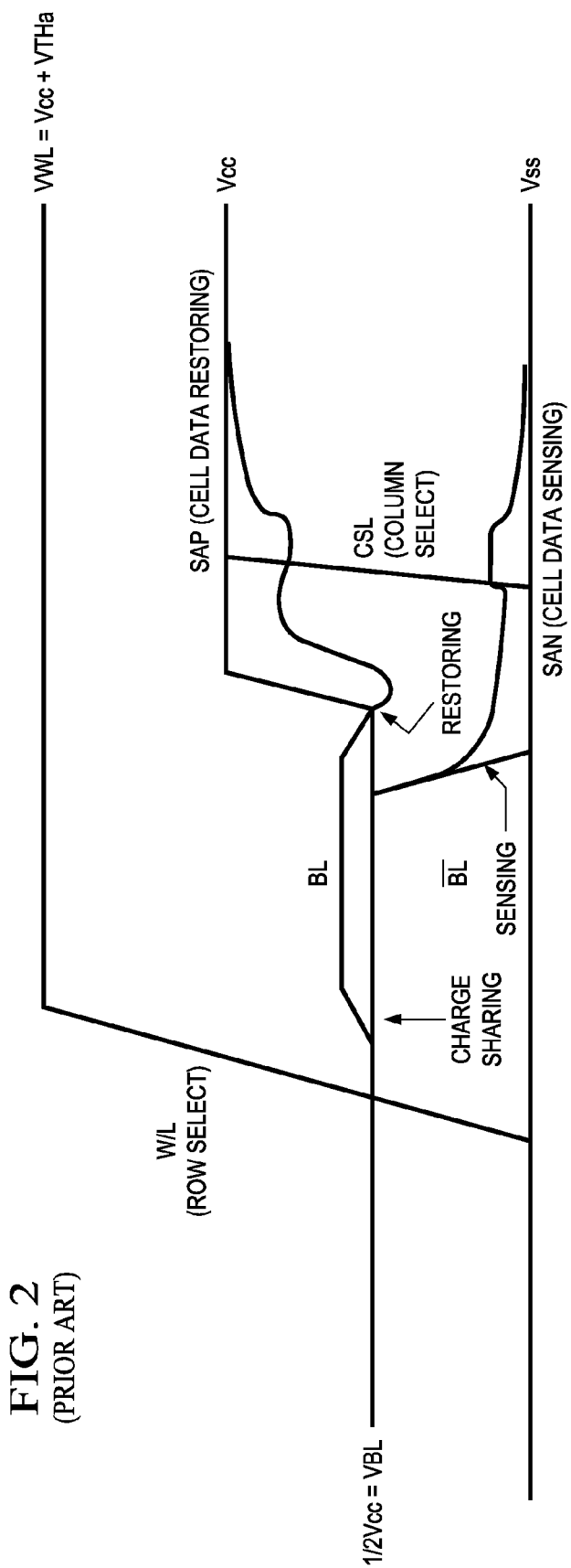
FIG. 2 illustrates a prior art timing diagram for the operation of the circuit of FIG. 1.

The timing of a memory cycle for the prior art is depicted in FIG. 2. Prior to the timing as shown in FIG. 2, the EQ signal of FIG. 1 is active and forces the bit lines B/L and B/L_ to a common, equalized voltage or "pre-charged" potential. Typically, in conventional DRAM devices the pre-charge voltage is set to a voltage approximately ½ of the positive supply voltage Vcc, which is approximately Vcc/2.

The memory access cycle begins when the active word line W/L transitions to a row select state. Since the memory access transistor in this example circuit in FIG. 1 is an NMOS transistor, the word line W/L transitions to a positive voltage to cause the transistor to couple the capacitor (not depicted) to the bit line B/L. The word line W/L is supplied by an address decode circuit (not depicted) that determines which row in the memory array is active based on an address supplied to the memory array. This circuitry is well known in the prior art and is not further described here. A short time after the word line W/L goes active by transitioning to a positive voltage level, the access transistor couples the capacitor of the memory cell MC1 to the respective bit line B/L and the "charge sharing" portion of the cycle begins. If the stored data is a logical "1," the storage capacitor will add voltage to the bit line B/L, as shown in FIG. 2. If the stored data is a logical "0," the storage capacitor may subtract voltage from the bit line B/L, for example, by charging the capacitor in the memory cell MC1 from the bit line B/L. These logical data assignments are arbitrary and may be reversed, as is known in the art.

After the "charge sharing" has begun, the timing diagram of FIG. 2 further illustrates that the sensing portion of the memory cycle begins. In this part of the memory cycle, the control line SAN, which is coupled to the two "pull down" NMOS transistors labeled TN1 and TN2 in FIG. 1, transitions from an equalized voltage of Vdd/2 to a low voltage of approximately Vss. Now one of the two NMOS transistors TN1 and TN2 has a different voltage at its gate input than the other one, and the transistor with the more positive gate voltage will conduct current, coupling the opposite bit line to a low voltage. In this manner the small differential input voltage from the selected memory cell MC1 is "sensed" by the sense amplifier S/A.

In FIG. 2, the bit line B/L_ begins falling at this part of the cycle, because the voltage at the gate of transistor TN2 is slightly higher than the initial voltage on B/L_, TN2 turns on and begins conducting. As the voltage at bit line B/L_ falls, transistor TN2 remains on and conducting. In contrast, transistor TN1 has a voltage on its source terminal of the voltage on bit line B/L plus a delta voltage which is higher than the gate voltage at bit line B/L_ at the beginning of the sense cycle, and thus remains turned off. As the voltage at bit line B/L_ falls further in response to the operation of transistor TN2, the transistor TN1 remains in cut off state and never conducts, thus the voltage on bit line B/L remains at the slightly increased voltage delta B/L over the initial voltage Vdd/2 at the beginning of the sense operation.

Next, as seen in FIG. 2, the prior art memory sensing operation transitions to the "restore" portion of the cycle. In the "restore" portion of the cycle, which in prior art sense amplifiers follows the "sense" portion by a time period typically of one or more logic gate delays, the control signal SAP transitions from the initial, equalized value to a high potential, for example Vcc. At this point the PMOS transistors TP1 and TP2 become important in the sense amplifier S/A. In FIG. 1, it can be seen that the node coupled to control signal SAP between the transistors TP1 and TP2 now rises to a high voltage. Transistor TP1 now has the low voltage on bit line B/L_ at its gate, and, because it is a PMOS transistor, it turns on and couples the bit line B/L to a high voltage. This causes the bit line B/L potential to increase from the voltage Vdd/2 (initial voltage on bit line B/L) plus the sensed differential voltage ΔVBL to a logical "1" high voltage, or approximately Vcc. The transistor TP2 is coupled at its gate to the potential on B/L and because the voltage is higher than at its source terminal, this transistor remains in cut off. As the voltage at bit line B/L increases, transistor TN2 turns on further and couples the bit line B/L_ to the low potential on control line SAN more completely, thus the two bit lines B/L and B/L_ are now at a logical "1" and a logical "0," that is at full logic voltage levels. At this point in the memory cycle, the word line W/L is still active so that the high voltage on bit line B/L is also coupled into the memory cell MC1, that is the access transistor of MC1 will couple this high voltage to the memory cell capacitor and thus restore the stored charge for future accesses to this memory cell.

Finally, the sense cycle is completed when the sense amplifier S/A is coupled to the I/O lines I/O by the operation of column select line CSL. This action causes the data represented by the potentials on bit lines B/L and B/L_ to be coupled to the I/O lines I/O for use by circuits external to the memory array.

The major factors contributing to mismatch in a memory circuit can be expressed as:

$$\Delta Vbl > 2\delta Vteff + (\delta Cgeff/Ct + \delta Keff/K + \delta Cbl^*(0.5m_{fet} + 0.5m_{cap})/m_{sum})^* Vsen, \quad (2)$$

where δ Vteff, δ Cgeff/Ct, δ Keff/K, and δ Cbl are: threshold voltage mismatch, gate-source capacitance mismatch of S/A devices, effective gm mismatch of S/A devices, and δ Cbl mismatch variations, respectively. The ratio $(0.5m_{fet} + 0.5m_{cap})/m_{sum}$ is an effective slope of SN and SP slopes, the pull down and pull up slopes respectively, at sensing. Vsen in Equation 2 or FIG. 1, is the voltage Vgs−Vt of an effective sense amplifier transistor device operated to supply the needed bitline or BL discharging current, i.e. $Keff^*Vsen^2/2 = 2\pi^*Ct^*(ms+mp)$.

In brief, threshold voltage Vt mismatch and activation speed (SN/SP slopes) are the major contributors to the Vcc minimum problem. Preferred embodiments of the present invention address both the mismatch problem and the activation speed problem, and, in a most preferred embodiment, both approaches are applied together.

Figure 3:
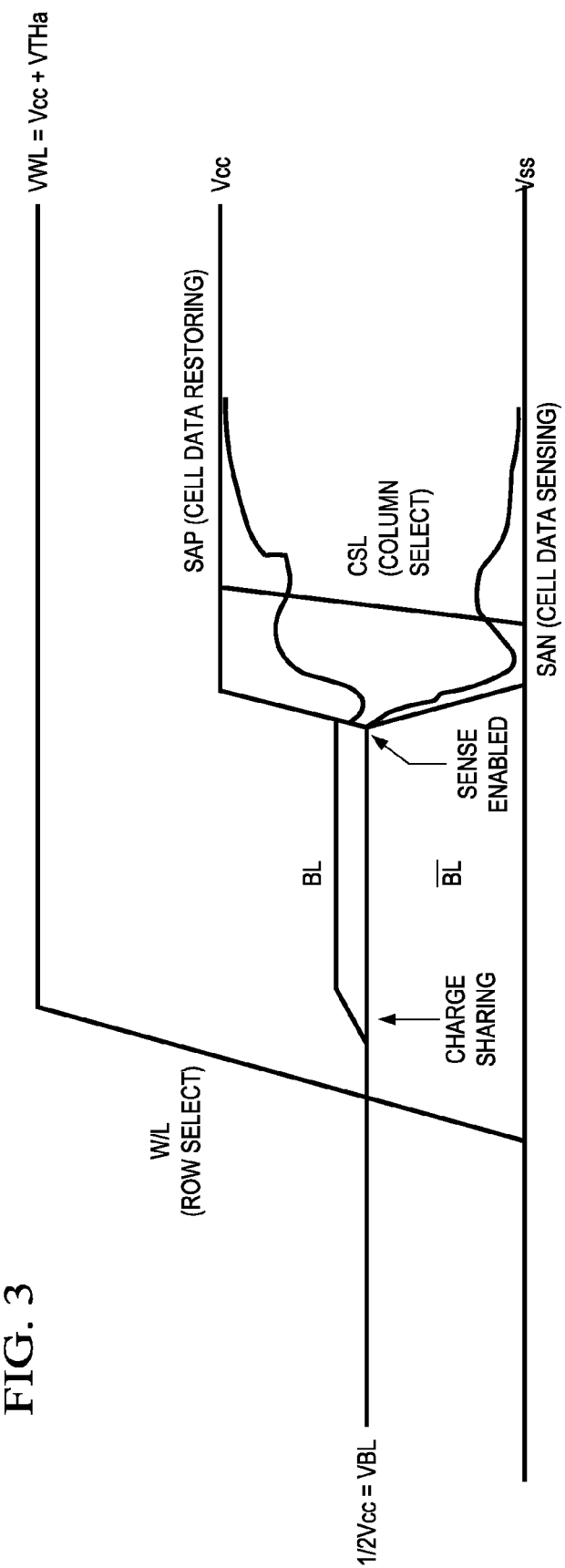
FIG. 3 illustrates a timing diagram for the operation of a first preferred embodiment of the present invention.

FIG. 3 depicts, in a timing diagram similar to that of FIG. 2, the operation of a sense amplifier of a first preferred embodiment of the invention. In FIG. 3, the timing of a memory cell read cycle is illustrated. Again, although not depicted for simplicity, the bit lines begin the memory cycle at an equalized or pre-charged level of approximately ½ the positive supply voltage. This voltage labeled VBL, is placed on the bit lines B/L and B/L_ by operation of the signal labeled EQ in FIG. 1. The signal EQ is activated and the two bit lines B/L and B/L_ are coupled together and to the voltage VBL for a time period sufficient to let them settle at that voltage. The signal EQ is then taken low and the transistors E1, E2, and E3 in FIG. 1 become inactive.

The memory cycle in FIG. 3 begins, again, with the transition of the row select or word line W/L to a high voltage. As the word line W/L passes through and moves above the voltage level VBL, the access transistor in memory cell MC1 becomes active, since the voltage at the gate of this NMOS transistor now exceeds the source voltage by more than the threshold voltage Vt. The memory cell MC1 then couples the capacitor of the cell to the bit line, in this case bit line B/L, and the charge sharing of the charge stored in the capacitor begins. This point in the cycle can be seen by the arrow labeled "charge sharing" in FIG. 3. The voltage on bit line B/L then begins to rise, in this example, because a logical "1" was stored in the memory cell MC1. Alternatively, the bit line B/L could fall if the capacitor of memory cell MC1 was discharging the bit line B/L, meaning the memory cell MC1 contained a discharged memory cell, indicating a logical "0."

Following a period of time where the memory cell MC1 shares its charge on the bit line B/L, the sense amplifier S/A is enabled. In contrast to the operation of the sense amplifiers of the prior art, in the first preferred embodiment of FIG. 3, the pull up transistors and pull down transistors of the sense amplifiers are enabled substantially instantaneously. This can be seen in FIG. 3 by the arrow labeled "sensing enabled." At this time, the control signal SAP transitions to a positive voltage, e.g., approximately equal to the positive supply voltage Vcc, and at the same point in time or substantially instantaneously, the control line SAN transitions to the ground potential or Vss voltage. For purposes of this application and the appended claims, the term "instantaneously" means, with respect to time, that two events occur substantially at the same time, or within less than or equal to about 20 picoseconds of each other. Unlike the sense amplifier operations of the prior art, the preferred embodiment sense amplifier and the associated control circuitry does not perform a separate "sense" step followed later by a "data restore" step, instead the positive and negative control signals SAP and SAN are provided together at the same time to the sense amplifier S/A and the "sense" and "restore" are enabled together.

Finally, as seen in FIG. 3, the output of the sense amplifier S/A is made available to the I/O lines I/O by operation of the column select line CSL, which couples bit lines B/L and B/L_ to the I/O lines I/O thereby providing the data stored in memory cell MC1 to the circuitry outside the memory array.

The advantages of the operation of the sense amplifier circuit using this preferred method can be better understood by calculating the change in current. The relation can be described using the following equations:

$$\Delta I_a = (I_Q/2) * [(K_{npm} * \Delta Vt)/(g_{mn}//g_{mp})] \quad (3)$$

$$\Delta I_b = (I_Q/2) * [(K_n * \Delta Vt)/(g_{mn})] \quad (4)$$

wherein Equation 3 is the change in current for the instantaneously enabled sensing in a sense amplifier as in the preferred embodiment, with the timing shown in FIG. 3, and Equation 4 is for the traditional pull-down and then restore data sense amplifier scheme, with the timing shown in the prior art approach of FIG. 2.

Assuming that current $I_Q$ (the node SN and node SP current source) is the same, the change in current for the preferred approach $\Delta I_a$ will be at least two times smaller than the change in current $\Delta I_b$, obtained previously. This improvement in performance is due to the smaller $K_{npm}$ factor and the bigger transconductance factor $g_{mn}//g_{mp}$. In simulations modeling a typical 65 nanometer semiconductor process using the preferred sense amplifier circuit and method of FIG. 3 in an embedded DRAM macro, a 270 mV improvement in Vcc minimum resulted. In a Monte-Carlo simulation result, the results revealed a better mismatch value by 30 mV for sense amplifier operation.

Figure 4:
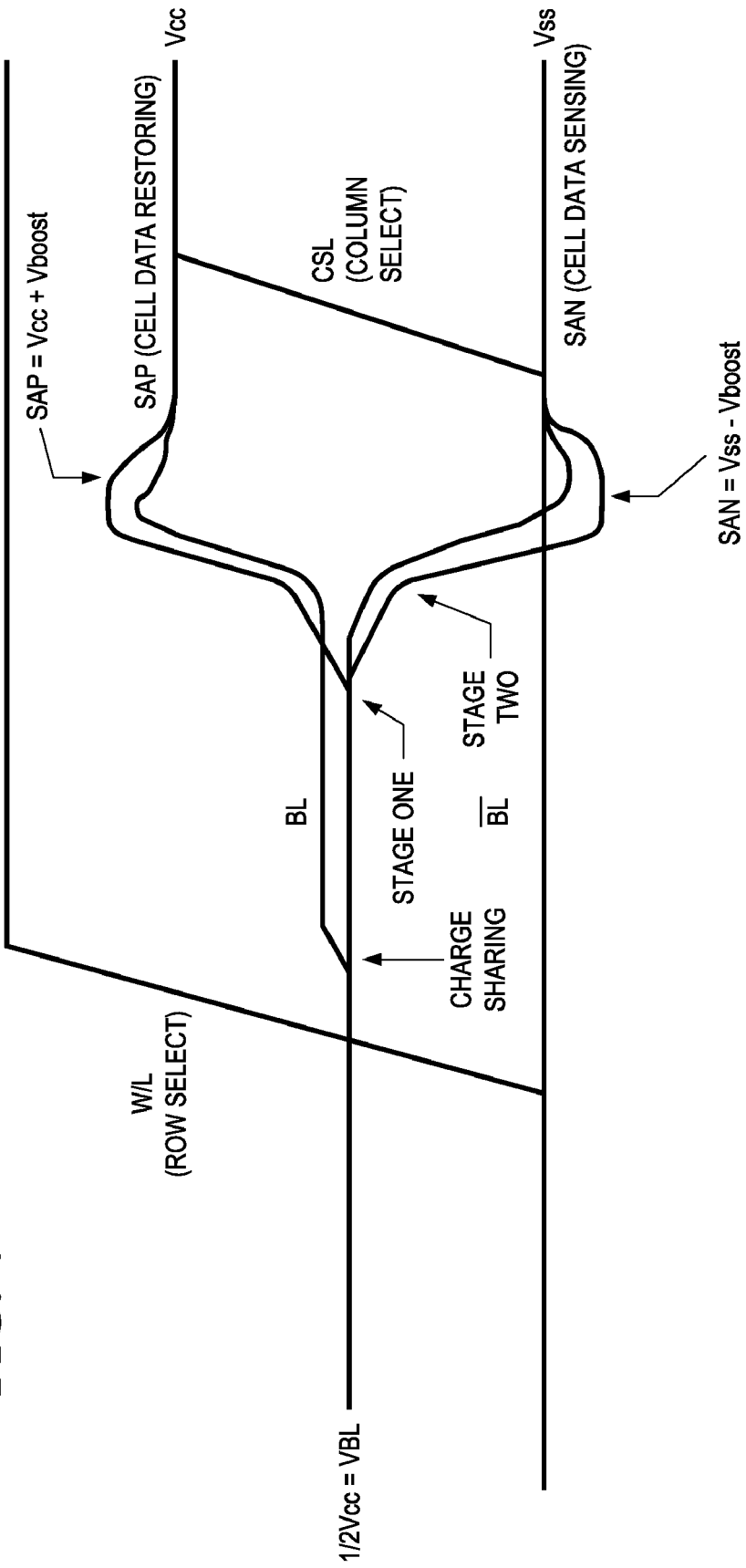
FIG. 4 illustrates a timing diagram for the operation of another preferred embodiment of the present invention.

Also, as seen in Equation 3, the $I_Q$ current should be lowered to improve performance. In yet another preferred embodiment, the sensing control signal voltages SAP and SAN are applied in a two stage sensing method. FIG. 4 depicts the timing of a sense amplifier operation using the preferred method of two stages of sensing. Again, before the memory cycle begins, the sense amplifier control signals SAP and SAN are equalized at an intermediate voltage, typically Vcc/2. The memory cycle begins, again as described above, when the active row select or word line W/L transitions to a high potential, thereby coupling a memory capacitance in a selected cell to bit line B/L. Again, in this example, the bit line B/L rises, indicating that the memory cell MC1 contained a charge typically representative of a logical "1" value stored in the cell.

In FIG. 4, the first stage of the two stages of sense amplifier sensing can be seen. In stage one, the positive control signal SAP transitions to a first positive voltage, the negative line SAN transitions to a first lower potential, and the sense latch within the sense amplifier S/A of FIG. 1, made up of the two pull down NMOS transistors, TN1 and TN2, and the two pull up PMOS transistors, TP1 and TP2, begins sensing and amplifying the differential input voltage and the bit lines B/L and B/L_ begin spreading apart.

When stage two of the preferred method two stage sensing operation begins, the positive control signal SAP is raised to a voltage above Vcc, which is Vcc plus a boost voltage. At the same time, in stage two of the sensing operation, the negative control line SAN is lowered to a voltage of less than Vss, or ground, by a negative boost voltage. The bit lines B/L and B/L_ then move to full logic levels and, since the word line W/L is still active, the data is available to restore the charge stored in the selected memory cell MC1. Finally the output of the sense amplifier S/A is again made available to the I/O lines I/O by operation of the column select line CSL, which couples the bit line pair B/L and B/L_ to the I/O lines I/O thereby providing the data stored in memory cell MC1 to the circuitry outside the memory array.

In the preferred two stage sensing method depicted in FIG. 4, the first stage has a lower level of sensing with a lower current; this gives a smaller mismatch. The second stage, with higher voltages and current supplied to speed up the overall sensing process, speeds the bit lines to their final full logic levels. By using the two stage sensing approach, the operation of the sense amplifier is still further improved. The slope of the sensing is increased in the second stage and this speeds operation of the sense amplifier.

FIG. 5 depicts in a table view the stage one and stage two potential voltages applied to the control signals SAN and SAP. As can be seen, the first stage operates by applying conventional voltage levels of Vss to SAN and Vcc to SAP, although as described above with respect to the first preferred embodiment and method of the present invention, these control signals are instantaneously applied to the sense amplifier, unlike the sensing operation of the prior art. In stage two of the preferred two level sensing approach, the control signals SAN and SAP are further boosted in their levels. Thus the positive control signal SAP transitions to a higher voltage above Vcc. The negative control signal SAN transitions to a lower voltage below Vss, to a negative boosted level. The second stage again applies these potentials to the control signals SAN and SAP at the same time.

FIGS. 6a and 6b depict preferred circuitry for implementing embodiments of the sense amplifier of the present invention. FIG. 6a depicts a differential circuit for generating signals P1 (pull up) and N1 (pull down) signals instantaneously in response to the input labeled Sensing Enable coupled to inverter I1. FIG. 6b depicts a driver circuit that acts as a sense amplifier equalization circuit when BLEQ is active, equalizing outputs SAN and SAP to a level VBL by operation of transistors Mn2, Mn3, Mn4 operating in a manner similar to the bit lines B/L and B/L_ equalization circuit of FIG. 1. When input BLEQ is inactive, the signals P1 and N1 enable the circuit to output signals SAP, the positive control signal, and SAN, the negative control signal, to the sense amplifier, instantaneously, or approximately at the same time, within a period of less than or equal to about 20 picoseconds apart.

Figure 7:
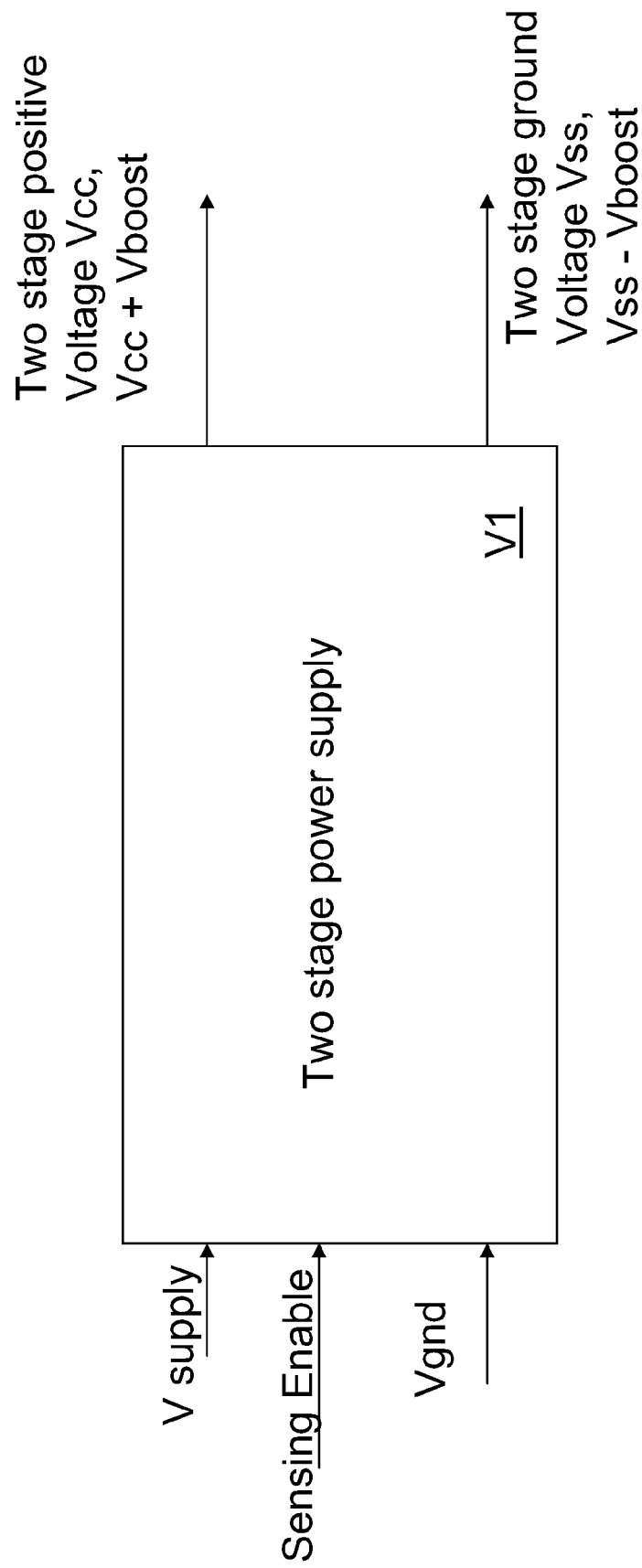
FIG. 7 depicts a two stage power supply circuit.

In FIG. 7, a two stage power supply V1 is illustrated for providing the positive voltage Vcc, and the ground voltage Vss, and the boosted voltages Vcc+Vboost, and Vss−Vboost, to the circuit of FIG. 6b. As described above, after an initial period following a sense enable signal, the Vcc voltage to the circuit of FIG. 6b is increased by at least a threshold voltage, and the Vss voltage is decreased by at least a threshold voltage, to improve the performance of the sense amplifier. The circuit of FIG. 6b couples the increased Vcc and decreased Vss voltages to the control signals SAP and SAN, respectively. As the timing diagram in FIG. 4 illustrates, the bit lines then also have an increased slope in the stage two operation and this speeds the data to the high and low levels.

In operation, the differential circuit depicted in FIG. 6a will receive an active low enable signal into the input of inverter I1 and, as a result, transistor Mn8 will pull signal P1 down. When line BLEQ goes to an inactive low state transistor Mp7 will pull signal N1 up to Vcc. Signal SAN will then be coupled to the two stage ground supply voltage in FIG. 6b and signal SAP will be coupled to the two stage positive supply voltage by operation of pull up transistor Mp1. The two stage supplies begin at the levels of FIG. 5, in the first stage, and transition to the greater and lesser potential levels in the second stage of the preferred sensing operation. The voltages in the second stage of sensing may vary but are preferably at least a voltage threshold Vt above Vcc (for SAP) and a voltage that is below Vss (for SAN). Other voltages can be used and these alternatives are also contemplated as part of the preferred embodiments of the invention and are within the scope of the appended claims.

In another preferred embodiment of the invention, the two aspects for improving the sense amplifier operations as illustrated in FIGS. 3 and 4 and as provided by the signal generator circuit and external power supplies of FIGS. 6a and 6b are used in conjunction with each other. In this preferred approach, the instantaneous supply of the pull up and pull down control signals to the sense amplifier is used with the two stage sensing method to provide the most improved performance over the prior art sense amplifier operations.

One skilled in the art will recognize that the use of the circuits of FIGS. 6a and 6b may be varied. Important features of these circuits include that they provide instantaneously the two control signals SAN and SAP to the sense amplifier, and the driver circuit of FIG. 6b also provides a convenient way to use the two level sensing approach of the preferred method. Other circuits could be used to implement these features and these alternatives are also contemplated as preferred embodiments of the invention and are within the scope of the appended claims. Although the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A memory circuit comprising:

at least one memory cell for storing a charge representative of a datum, the memory cell coupled to a row select signal and a column signal and outputting a small voltage on the column signal responsive to the row select signal;

a sense amplifier circuit coupled to the column signal and to another complementary column signal for receiving a small signal differential voltage, having a cross coupled latch comprised of two inverters receiving the small signal differential voltage and having outputs coupled to the column signal and to the complementary column signal, and receiving a pull down control signal and a pull up control signal; and a differential signal generator circuit coupled to a positive supply voltage and to a negative supply voltage and receiving an enable signal, the differential signal generator circuit generating the pull down control signal and pull up control signal substantially instantaneously, responsive to the enable signal; and wherein the differential signal generator circuit further comprises:

a sense amplifier equalization circuit coupled to the pull up control signal and the pull down control signal, the sense amplifier equalization circuit operable to equalize the pull up control signal and the pull down control signal to a first potential in a pre-charge operation; and wherein the sense amplifier equalization circuit is coupled to the first node and to the second node and the sense amplifier equalization circuit further comprises a first transistor receiving the first node at a control input and coupled between the pull up control signal and a first voltage terminal, the first voltage terminal receiving a positive voltage that is one selected from a first positive voltage and a second positive voltage that is greater than the first positive voltage by a boost voltage; and a second transistor having a control input coupled to the second node and coupled between the pull down control signal and a second voltage terminal, the second voltage terminal receiving a ground voltage that is one selected from a first ground voltage and a second ground voltage that is lower than the first ground voltage by a boost voltage.

2. The memory circuit of claim 1, wherein the differential signal generator circuit further comprises a differential output circuit having a first input branch and a second input branch, the first input branch comprising a first pull up transistor coupled between a positive power supply and a first node, and a first pull down transistor coupled between the first node and a common node, and having a sensing enable signal coupled to a control input of the first pull down transistor, and the second input branch comprising a second pull up transistor coupled between the positive supply potential and a second node, having a control input coupled to a pre-charge control signal, and a second pull down transistor coupled between the second node and the common node and having a fixed potential at a control input;

wherein the differential output circuit generates a low potential on the first node and a high potential on the second node responsive to the sensing enable signal.

3. The memory circuit of claim 1, wherein the memory cell shares charge onto the column signal responsive to a potential on the row select signal and the potential on the column signal moves from a pre-charge potential to a differential potential differing from a second potential on the complementary column signal.

4. The memory circuit of claim 3, wherein the differential potential is received at the sense amplifier circuit and creates a differential input voltage in the cross-coupled latch and subsequently, the cross-coupled latch transitions to full logic voltage levels in response to the pull down control signal and the pull up control signal.

5. A method for sensing a charge stored in a memory cell, the method comprising:

providing the memory cell for storing the charge indicative of a data value, the memory cell coupled to a row select line and a first column signal and outputting a voltage potential on the first column signal responsive to a voltage potential on the row select line;

providing a differential input sense amplifier coupled to the first column signal and to a complementary column signal, the differential input sense amplifier comprising a differential latch circuit for receiving a differential input voltage on the first column signal and for outputting an amplified differential signal responsive to receiving a pull up control signal and a pull down control signal;

providing a signal generator circuit for outputting the pull up control signal at a first positive potential and the pull down control signal at a second potential lower than the first positive potential substantially instantaneously in response to an enable signal;

providing a select potential on the row select line to cause the memory cell to share charge and to cause a differential voltage on the first column signal; and substantially instantaneously providing the pull up control signal at the first positive potential and the pull down control signal at the second potential lower than the first positive potential to the differential input sense amplifier; and wherein providing the pull up control signal at a first positive potential and the pull down control signal at a second potential comprises providing a pull up control signal at a positive supply voltage level and providing the pull down control signal at a ground voltage level; and wherein providing the pull up control signal further comprises providing a voltage level on the pull up control signal that is increased over the positive supply voltage by a boost voltage and providing the pull down control signal further comprises providing a voltage level on the pull down control signal that is decreased below the ground voltage level by a negative boost voltage.

6. The method of claim 5, wherein providing the signal generator circuit further comprises providing a differential output circuit having a first branch outputting a first potential on a first node, and outputting a second complementary potential on a second node, responsive to a sense enable control signal; and providing a sense amplifier equalization circuit coupled between the pull up control signal and the pull down control signal coupling the pull up control signal and the pull down control signal together to a precharge potential less than the first positive potential responsive to an equalization signal.

7. An integrated circuit comprising:

digital logic circuitry providing a user specified function responsive to receiving input signals, and generating output signals; and a memory circuit coupled to the digital logic circuitry, comprising:

a plurality of memory cells organized in rows and columns, each memory cell coupled to a row select line arranged in one of the rows, and each memory cell coupled to a bit line selected from bit lines arranged in columns of pairs of bit lines and complementary bit lines;

a sense amplifier circuit coupled to a selected pair of the columns of the bit lines and the complementary bit lines, the sense amplifier comprising a differential input for receiving a small signal differential voltage and having a cross-coupled latch for storing the small signal differential voltage, and having outputs coupled to the respective bit line and complementary bit line signals, and receiving a pull down control signal and a pull up control signal; and a signal generator circuit coupled to the sense amplifier circuit and substantially instantaneously outputting the pull down control signal and pull up control signal, the signal generator circuit further comprising a sense amplifier equalization circuit coupled to generate the pull up control signal and the pull down control signal, the sense amplifier equalization circuit equalizing the pull up control signal and the pull down control signal to a first potential in a pre-charge operation, and in response to a control signal received after the pre-charge operation, substantially instantaneously outputting the pull up control signal at a positive supply voltage potential and the pull down control signal at a ground potential; and wherein the first potential is a positive signal less than the positive supply signal, and the sense amplifier equalization circuit subsequently outputs the pull up control signal at an increased second pull up control signal voltage greater than the positive supply signal by a positive boosted voltage, and outputs the pull down control signal at a decreased second pull down control signal voltage less than a ground potential by a negative boosted voltage.

8. The integrated circuit of claim 7, wherein the signal generator circuit further comprises a differential output circuit having a first input branch and a second input branch, the first input branch comprising a first pull up transistor coupled between the positive supply signal and a first node, and a first pull down transistor coupled between the first node and a common node and having a sensing enable signal at its control input, the second input branch comprising a second pull up transistor coupled between the positive supply potential and a second node, having a control input coupled to a precharge control signal, and a second pull down transistor coupled between the second node and the common node, and having a fixed potential at its control input; and the differential output circuit generating a low potential on the first node and a high potential on the second node responsive to the sensing enable signal.

9. The integrated circuit of claim 8, wherein the sense amplifier equalization circuit is coupled to the first node and coupled to the second node and generates the pull up control signal responsive to the potential on the first node, and generates the pull down control signal responsive to the potential on the second node.

\* \* \* \* \*